United States Patent [19]

Gabrail

[11] 3,762,973

[45] Oct. 2, 1973

[54] METHOD OF ETCH SUBDIVIDING SEMICONDUCTOR WAFERS

[75] Inventor: Sami I. Gabrail, Syracuse, N.Y.

[73] Assignee: General Electric Company, Syracuse, N.Y.

[22] Filed: Apr. 1, 1969

[21] Appl. No.: 812,182

[52] U.S. Cl. .................. 156/17, 156/253, 156/345, 29/583

[51] Int. Cl. .................. H01l 7/50

[58] Field of Search .................. 156/17, 253, 345; 29/583

[56] References Cited

UNITED STATES PATENTS

| | | | |
|---|---|---|---|
| 2,762,954 | 9/1956 | Leifer | 317/235 |
| 3,461,537 | 8/1969 | Lotz | 29/413 |

FOREIGN PATENTS OR APPLICATIONS

| | | | |
|---|---|---|---|
| 1,142,420 | 1/1963 | Germany | 156/17 |

*Primary Examiner*—Jacob H. Steinberg
*Attorney*—Robert J. Mooney, Nathan J. Cornfeld, Frank L. Neuhauser, Oscar B. Waddell and Joseph B. Forman

[57] ABSTRACT

This invention relates to a method of increasing the spacing between the confronting side walls of adjacent semiconductor pellets constituting portions of a subdivided wafer of semiconductor material secured to a flexible substrate without disturbing the relative orientation which the portions had in the parent wafer before its subdivision. The substrate is bent to form grooves of tapered cross-section between the confronting side walls of the adjacent pellets. An etchant is then placed in the grooves so as to etch the exposed side walls of the pellets and thereby enlarge the cross-section of the grooves and the consequent spacing of the pellets, without disturbing the original relative orientation of the pellets.

6 Claims, 8 Drawing Figures

INVENTOR:
SAMI I. GABRAIL,
BY Robert J. Mooney
HIS ATTORNEY.

INVENTOR:
SAMI I. GABRAIL,

BY Robert J. Mooney
HIS ATTORNEY.

METHOD OF ETCH SUBDIVIDING SEMICONDUCTOR WAFERS

This invention relates to the manufacture of semiconductor devices. More particularly, the invention relates to an improved method of subdividing a semiconductor wafer into individual pellets.

The semiconductor art has been burdened with many problems relating to the subdividing of semiconductor wafers into individual pellets. The most commonly used conventional subdividing method consists of securing a wafer, using a wax, on a shim by techniques well known to those skilled in the art. A shim is typically a thin rectangular-shaped flexible metallic plate.

Once the shim secured wafer is positioned, a diamond scriber is drawn across predetermined scribe passages in order to form a plurality of rectangular shapes on the top surface of the wafer. The scribed wafer is then flexed on a curved support member to fracture the wafer into pellets along the scribe passages. The subdivided wafer is next placed in an ultrasonic bath to dissolve the wax securing the pellets to the shim in order to remove the individual pellets.

This method suffers from a number of serious limitations. First, once the pellets are removed from the shim they lose their original orientation in the parent wafer. Second, the edges of the pellets, along the fractured scribe lines, are extremely ragged. Additionally, the pellets are not easily removed from the shim one at a time because they are not spaced far enough apart from each other.

Accordingly, one object of this invention is to provide a simplified, improved and less expensive method of forming a semiconductor wafer into individually readily removable pellets without disturbing the original position or orientation of any pellet in the parent wafer.

Another object of this ivention is to provide an improved method of subdividing a semiconductor wafer into individual pellets so that the pellets can be individually removed from the parent wafer.

Still another object of this invention is to provide an improved method of forming a semiconductor wafer into individual pellets having relatively smooth, slightly sloping side walls.

These and other objects of this invention will be apparent from the following description and the accompanying drawing, wherein.

Briefly, the above-mentioned objectives are accomplished by a series of steps initiated by mounting a semiconductor, suitably scribed or otherwise marked or structurally weakened by techniques well known to those skilled in the art so as to establish selected fracture loci, on a flexible plate or support member, with the marked face of the wafer down. Next, a stress is induced along the scribe marks by moving a compressive inducing member across the non-marked face of the wafer thereby fracturing the wafer into individual pellets. These pellets continue to remain secured to the plate in essentially the same position they occupied prior to the fracturing of the wafer. The subdivided wafer while still secured to the plate is then bent around a mandrel such that the fractures between adjacent pellets are opened into V-shaped grooves. The subdivided wafer is then immersed in an etchant solution in order to enlarge the grooves and smooth the side walls of the pellets.

Figure 1:
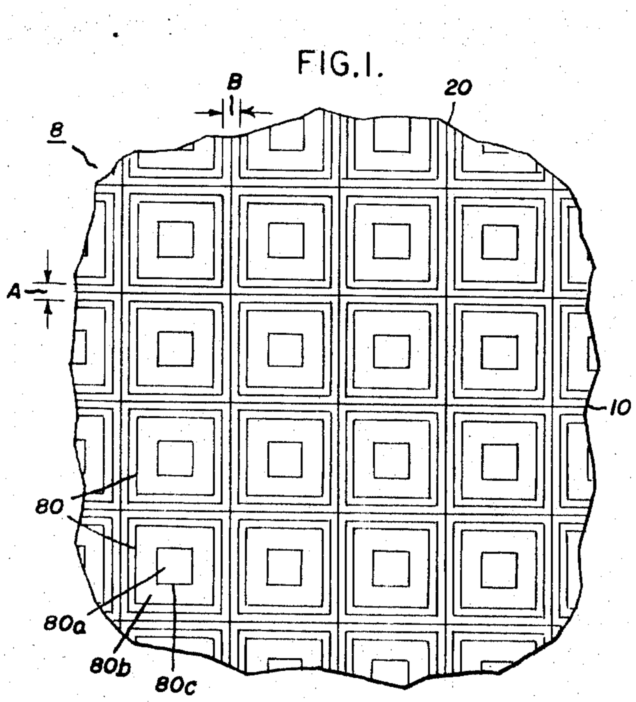
FIG. 1 is an enlarged fragmentary plan view of a scribed semiconductor wafer to which this invention is particularly applicable.

In FIG. 1 there is shown a top view of a portion of a semiconductor wafer 8. Formed in the wafer by diffusion and masking techniques well known to those skilled in the art are individual semiconductor devices 80. These devices 80 may be, for example, diodes, transistors, thyristors, integrated circuit devices or any combination thereof. As shown, the devices 80 in FIG. 1 are PN junction diodes each comprising a P-type anode region 80*a* which is formed in an N-type cathode substrate 80*b*, thus producing a PN junction 80*c*. The substrate 80*b* may be made of any conventional semiconductor material but is preferably silicon. Although not shown on wafer 8, it is appreciated that any or all of the normal junction-covering and protective insulative layers as well as the contact electrodes whose composition and function are well understood by those skilled in the art, may be present on the wafer surface concurrent with the practice of my invention.

A and B in FIG. 1 outline scribe passages formed on the wafer 8 by techniques well known to those skilled in the art and are used as guidelines during the scribing operation. The scribe marks 10 and 20 in FIG. 1 represent the depressions (no semiconductor material is removed) made in the scribe passages A and B respectively of the wafer 8. The formation of these depressions structurally weakens the wafer along predetermined planes under 10 and 20 during the scribing operation. Such planes are hereinafter also referred to as fracture loci. Generally, the scribe passages are surfaced with a protective insulative layer which may be, for example, silicon dioxide, and/or silicon nitride. When present, the depressions 10 and 20 are formed in this layer. It is appreciated that there are other methods of structurally weakening the wafer to compression along these predetermined planes such as sawing, sand blasting, etc., which may be used in performing this invention. It is further appreciated that both the number and configuration of the scribe marks used and the resulting pellet shapes that they form can be varied from the exemplary rectilinear grid pattern shown.

Figure 2:
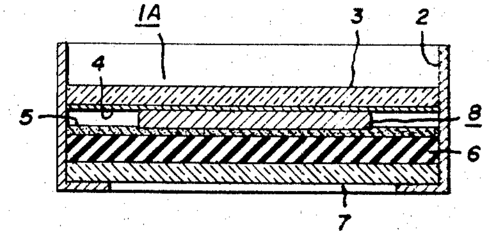
FIG. 2 is a cross-sectional view of a fixture containing the scribed semiconductor wafer shown in FIG. 1 at an intermediate stage of processing.
Figure 2A:
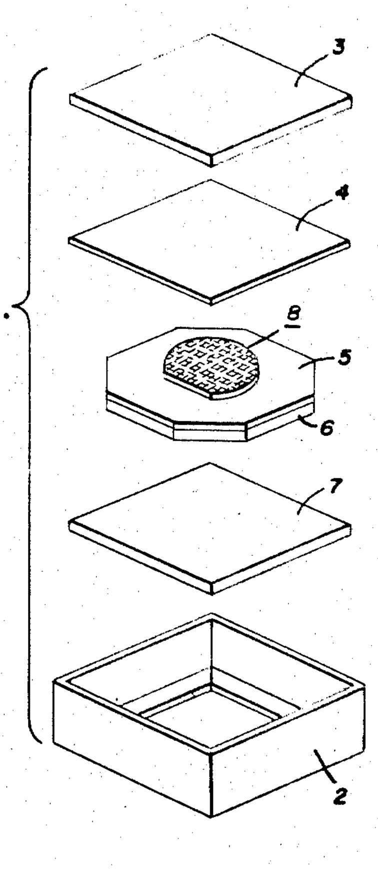
FIG. 2A is an exploded perspective view, to a diminished scale, of the arrangement shown in FIG. 2.

The wafer 8 having first and second opposed major surfaces, one of which is scribed as shown in FIG. 1, is mounted on a plate with the scribed face adjacent the surface of the plate. Referring particularly to FIGS. 2 and 2A, a flexible plate 6 which may be, for example, silicone rubber is first sprayed on at least one of its major faces with a resilient and etch resistant adhesive layer 5 which may be, for example, a vaseline-plasticized apiezon wax. A suitable formulation for such wax is, in parts by weight, 2 parts vaseline, 2 parts xylene, and 8 parts apiezon wax. A suitable frame 2 having a removable glass bottom plate 7 is then used to hold the plate coated with the adhesive layer 5 facing upward, or away from the glass plate 7. The pellet 8 is then placed with its scribed face engaging the adhesive layer 5. If the opposite or unscribed major face of the wafer 8 is surfaced with a metal other than silicon it is also covered with a suitable protective coating to protect it during any subsequent etching step or steps. It might be desirable, for example, to deposit or attach ohmic contacts to the devices of the wafer before the subdividing process is initiated. A thin sheet of absorbant material 4, such as filter paper, is then placed over the top of the unscribed surface of the wafer 8. A few drops of a viscous dielectric such as ethylene glycol are then deposited on the paper 4 in order to hold the wafer 8 in place and prevent anything from sticking to the wafer during subsequent process steps. A top glass plate 3 is then placed on top of the paper 4, thereby forming a glass sandwich 1A around the wafer 8 to facilitate embedding the scribed wafer 8 in the adhesive layer.

The entire assembly as shown in FIG. 2 is then heated to a sufficient temperature to cause the adhesive layer 5 to begin to soften. While still being heated, a weight is applied to the top of the glass plate 3 to help flatten out the sandwich 1A and also to help at least partially embed the wafer 8 in the wax layer 5. The whole assembly including the weight is then cooled to room temperature. The glass plates 3 and 7 are then removed followed by the absorbant paper 4. The scribed and mounted wafer 8 is now ready to be fractured. It is, of course, appreciated that there are other suitable means to mount the wafer that also can be used as long as the wafer is secured and protected as discussed above.

Figure 3:
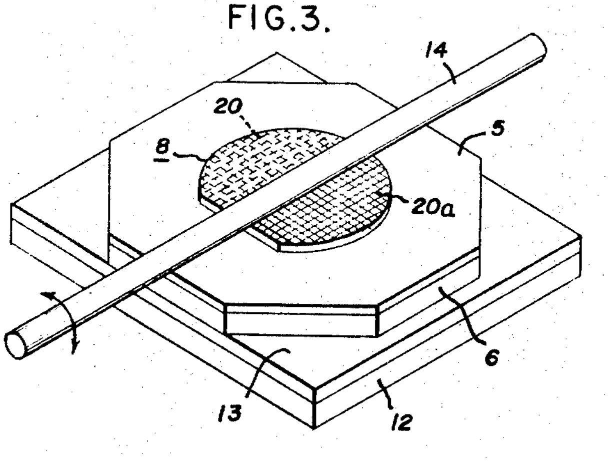
FIG. 3 is a perspective view of a scribed semiconductor wafer such as shown in FIG. 1 along with apparatus useful in performing this invention.

FIG. 3 shows one suitable arrangement for applying a stress to induce the fracturing of the wafer 8 along the scribe lines 10 and 20. The flexible plate 6 having the scribed face of the wafer 8 secured to its top surface by wax layer 5 is placed onto a flexible mat 13, which in turn rests on a metal plate 12. A substantially rigid rod 14 which may be, for example a metal rod, is then moved across the unscribed surface of wafer 8. As shown in FIG. 3, the rod is being rolled across the wafer sufrace from left to right. Fractures 20a are formed along the scribe lines 20 over the area covered by the rod. Once fractures 20*a* are produced along all the scribe lines 20 the rod is moved across the wafer at right angles in order to fracture the wafer along the scribe lines 10. Thus, the wafer is subdivided into pellets without disturbing either the position or orientation of any pellet in the wafer.

It is, of course, recognized that other types and shapes of compressive members capable of providing a compressive force can also be used. Further, the desired compressive force can be applied all at one time or in a series of applications.

Figure 5:
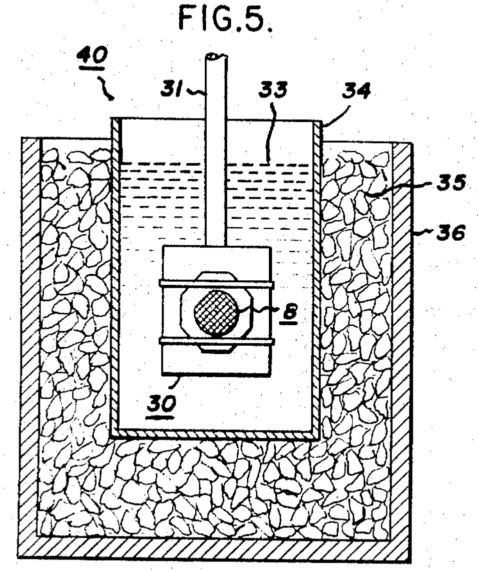
FIG. 5 is a cross-sectional view to a diminished scale, of an apparatus useful in the performance of the final step in the process of the present invention.

Without removal from flexible plate 6 and hence without disturbing the relative orientation of its pellets, the wafer 8, upon completion of the fracturing, is secured to a suitable curved surface such as the cylinder portion of the mandrel 30 as shown in FIG. 5. In this way, the flexible substrate 6 is bent to form notch-shaped grooves between the adjacent pellets by exposing the confronting side walls of the pellets.

Figure 4:
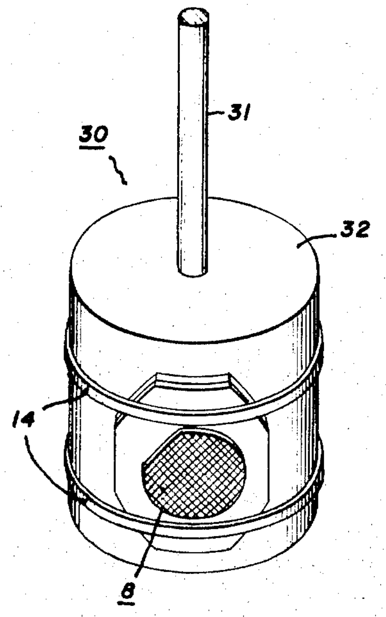
FIG. 4 is a perspective view, to a diminished scale, of the scribed and fractured semiconductor wafer shown in FIG. 3 with other apparatus useful in the performance of the present invention.
Figure 4A:
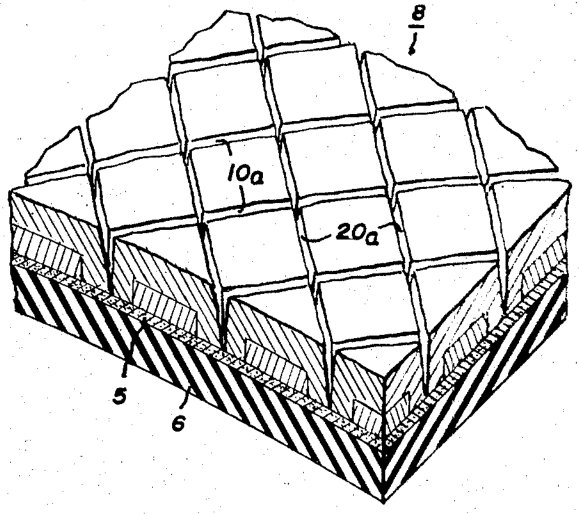
FIG. 4A is an enlarged fragmentary perspective view of the scribed and fractured semiconductor wafer shown in FIG. 4 and illustrating the bended condition imposed upon it by the supporting apparatus of FIG. 4.

To open both sets of fracture lines 10 and 20 into V-grooves in a single bending operation, the wafer is oriented on the mandrel 30 so that lines 10 and 20 form an acute angle, preferably about 45°, to the vertical axis of the mandrel 30. This bending action separates the fractured pellets from their adjacent neighbors around their entire edge periphery. The effect of this bending operation on the wafer 8 is shown in FIG. 4A. It should be noted that the fractures 10*a* and 20*a* are now notch-shaped (preferably in a V-shaped notch) and have provided grooves of tapering cross-section between the confronting side walls of adjacent pellets. Attached to the cylinder 32 is a handle 31. It is, of course, appreciated that other types and shapes of curved surfaces capable of providing a bending action can also be used. Also, the scribe lines could be parallel to the axis of the mandrel but in this case it would require a two-step bending operation to separate the pellets first in one direction then in the other.

Figure 5A:
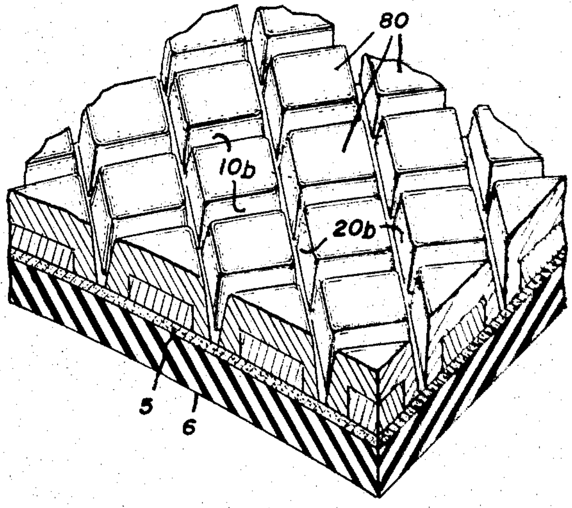
FIG. 5A is a perspective view, to the same enlarged scale employed in FIG. 4A, of the scribed and fractured semiconductor wafer shown in FIG. 5 following completion of the process of the present invention.

The scribed, mounted and bent wafer 8 is now ready to be etched. In order to maintain the desired V-shaped form of the grooves 10*a* and 20*a* after the bending force is removed a suitable etch fixture such 36 40 as shown in FIG. 5 is used. A container 36 is first packed with a refrigerant such as ice 35 followed by inserting an etch resistant container 34 into the ice 35. The etch resistant container 34 is then filled with a conventional silicon etch solution 33. The ice 35 is used to prevent the reaction temperature of the etch solution 33 from exceeding the softening temperature of the wax layer. The mandrel 30 and the wafer 8 are then immersed in the etch solution 33 for a sufficient time (time varies depending on etch solution used) to permanently form the V-shaped grooves of the pellets 80. The subdivided wafer 8 upon completion of the above-mentioned etch step and after its removal from the mandrel 30 is shown in FIG. 5A. Thus, by placing the etchant in contact with the grooves between the pellets, the side walls are attacked, thereby rounding the edges, reducing the asperities and increasing the separation of adjacent pellets (preferably to a minimum transverse dimension of at least 0.002 inch at the major face of the wafer adjacent to the substrate) without disturbing the relative orientation of the pellets. It should be noted that the tapered side walls of the pellets 80 are now relatively smooth and form V-shaped grooves 10*b* and 20*b*, even though the flexible plate 6 is now returned to its initial flat form. The pellets 80 are now separated islands secured in the wax layer 5 in the very same location and with the very same orientation they held in the wafer prior to the formation of the original subdivision lines 10 and 20.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What we claim as new and desire to secure by Letters Patent of the United States is:

1. A method of operating on a parent wafer of semiconductor material embodying a plurality of PN junction semiconductor devices formed adjacent one major face of said wafer, said method converting said wafer to a plurality of spaced increments having the same relative orientation as before such conversion but each containing one of said semiconductor devices, and comprising the steps of:

forming flex-responsive fracture loci in said wafer between said semiconductor devices;

adhering said one major face of the wafer to a bendable support by a layer of adhesive material;

flexing said support and adhered wafer and thereby subdividing the wafer into said increments containing each a single one of said semiconductor devices and having adjacent confronting side walls generally normal to the major faces of said wafer and having the same relative orientation as before the subdivision of said wafer;

bending the bendable support and the wafer secured thereto to form between the confronting side walls of said adjacent increments v-shaped grooves;

etching the side walls of said grooves while the bendable support and wafer secured thereto are maintained in bended condition and while said one major face of said wafer is protected by said adhesive material from etching, whereby said grooves are widened without disturbing the relative orientation which said increments had in said parent wafer; and unbending the bendable support and wafer increments secured thereto without disturbing the relative orientation which said increments had in said parent wafer.

2. The method defined in claim 1 wherein the wafer is secured to the support by an adhesive resilient wax.

3. The method defined in claim 1 wherein said wafer is refrigerated during the etching thereof.

4. The method defined in claim 1 where said subdividing is accomplished by scribing and breaking said wafer.

5. The method defined in claim 1 wherein said wafer is bent about an axis of curvature with which said grooves make an acute angle of about 45°.

6. The method defined in claim 1 wherein said grooves are enlarged sufficiently to have a minimum transverse dimension of at least 0.002 inch at the major face of said wafer adjacent said support.

* * * * *